United States Patent
Wu et al.

(10) Patent No.: US 11,874,302 B2
(45) Date of Patent: Jan. 16, 2024

(54) DIGITAL OSCILLOSCOPE AND OSCILLOGRAM GENERATION SYSTEM

(71) Applicant: BOE TECHNOLOGY GROUP CO., LTD., Beijing (CN)

(72) Inventors: Congrui Wu, Beijing (CN); Lihua Geng, Beijing (CN); Xitong Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 17/418,374

(22) PCT Filed: Dec. 29, 2020

(86) PCT No.: PCT/CN2020/140498
§ 371 (c)(1),
(2) Date: Jun. 25, 2021

(87) PCT Pub. No.: WO2021/169558
PCT Pub. Date: Sep. 2, 2021

(65) Prior Publication Data
US 2022/0308089 A1    Sep. 29, 2022

(30) Foreign Application Priority Data
Feb. 27, 2020 (CN) .......................... 202010125630.7

(51) Int. Cl.
*G01R 13/02* (2006.01)

(52) U.S. Cl.
CPC ..... *G01R 13/0236* (2013.01); *G01R 13/0245* (2013.01)

(58) Field of Classification Search
CPC ............ G01R 13/0218; G01R 13/0236; G01R 13/0245; G01R 13/30; G06F 3/0412;
(Continued)

(56) References Cited

U.S. PATENT DOCUMENTS 6,518,744 B1   2/2003  Tallman et al.
8,717,435 B2   5/2014  Faragher
(Continued)

FOREIGN PATENT DOCUMENTS

CA    2661650 C    4/2009
CA    2661650 A1   10/2009
(Continued)

OTHER PUBLICATIONS

International Search Report and Written Opinion from PCT/CN2020/140498 dated Apr. 1, 2021.
(Continued)

*Primary Examiner* — Xilin Guo
(74) *Attorney, Agent, or Firm* — Calfee, Halter & Griswold LLP (57) ABSTRACT

A digital oscilloscope includes a video input interface, a data processing system, a video output interface, and a clock system. The video input interface is configured to receive a digital video signal; the data processing system receives the digital video signal and processes the digital video signal to generate an oscillogram signal, which includes an oscillogram image and further includes one of a menu image and a frame image of the digital video signal; and the video output interface is connected to the data processing system, receives the oscillogram signal and outputs it to external terminals. The oscilloscope can display a variety of image information, with high intuitiveness, simplified structure, improved portability, and is convenient to use in outdoor places.

16 Claims, 3 Drawing Sheets

(58) Field of Classification Search
CPC ......... G06F 18/213; G06T 2207/10016; G06T 11/203; H04N 11/12; H04N 17/00; H04N 21/431; H04N 21/44016; H04N 9/64; G08B 17/125; G06V 20/40; G06V 10/56; G10L 25/57

See application file for complete search history.

(56) References Cited

U.S. PATENT DOCUMENTS

| | | | |
|---|---|---|---|
| 9,001,213 | B2 | 4/2015 | Adams et al. |
| 10,365,301 | B2 | 7/2019 | Guenther |
| 2004/0005141 | A1* | 1/2004 | Combs ............... H04N 5/76 348/E7.086 |
| 2004/0223577 | A1* | 11/2004 | Watanabe ............ H04L 1/205 375/376 |
| 2006/0224340 | A1 | 10/2006 | Imamura |
| 2009/0256907 | A1 | 10/2009 | Faragher |
| 2014/0240517 | A1 | 8/2014 | Adams et al. |
| 2022/0021195 | A1* | 1/2022 | Rathi ............... H02H 3/167 |

FOREIGN PATENT DOCUMENTS

| | | |
|---|---|---|
| CA | 2661650 C | 6/2012 |
| CN | 1245292 A | 2/2000 |
| CN | 1317694 A | 10/2001 |
| CN | 102053185 A | 5/2011 |
| CN | 102495255 A | 6/2012 |
| CN | 102495256 A | 6/2012 |
| CN | 102945026 A | 2/2013 |
| CN | 103018513 A | 4/2013 |
| CN | 103604965 A | 2/2014 |
| CN | 103604967 A | 2/2014 |
| CN | 103713172 A | 4/2014 |
| CN | 103905817 A | 7/2014 |
| CN | 103905817 B | 1/2016 |
| CN | 106018911 A | 10/2016 |
| CN | 107102186 A | 8/2017 |
| CN | 207636655 U | 7/2018 |
| CN | 109212449 A | 1/2019 |
| CN | 109379513 A | 2/2019 |
| CN | 111323627 A | 6/2020 |
| DE | 69609236 T2 | 3/2001 |
| EP | 0738089 A1 | 10/1996 |
| EP | 0971237 A2 | 1/2000 |
| EP | 0738089 B1 | 7/2000 |
| EP | 0971237 A3 | 9/2000 |
| EP | 1139103 A1 | 4/2001 |
| EP | 1139103 A1 | 10/2001 |
| EP | 1139103 B1 | 10/2006 |
| EP | 2286597 A2 | 2/2011 |
| EP | 2286597 B1 | 2/2011 |
| EP | 2784520 A3 | 10/2014 |
| EP | 2784520 A3 | 2/2015 |
| EP | 2286597 B1 | 6/2015 |
| GB | 2511073 A | 8/2014 |
| GB | 2511073 B | 3/2017 |
| JP | 2006279672 A | 10/2006 |
| JP | 2014041118 A | 3/2014 |
| WO | 2010011374 A2 | 1/2010 |
| WO | 2010011374 A3 | 3/2010 |

OTHER PUBLICATIONS

First Office Action from Chinese Application No. 202010125630.7 dated Jan. 26, 2021.

Notice of Allowance from Chinese Application No. 202010125630.7 dated Jul. 6, 2021.

Siyuan et al. "Based on the number of LabVIEW digital video oscilloscope" Mar. 15, 2014 (7 pages).

Han et al., "DTV Lip-sync Test Using Time Indexed Audio and Video Signals Without Effect on Program" 2003 IEEE, pp. 194-195.

* cited by examiner

DIGITAL OSCILLOSCOPE AND OSCILLOGRAM GENERATION SYSTEM

CROSS-REFERENCE TO RELATED APPLICATIONS

The present disclosure is a national application of PCT Application No. PCT/CN2020/140498, filed Dec. 29, 2020, which claims the priority of the Chinese patent application No. 202010125630.7 filed on Feb. 27, 2020, the entire contents of both of which are incorporated herein by reference as part of the present disclosure.

TECHNICAL FIELD

The present disclosure relates to the technical field of oscilloscopes, in particular, to a digital oscilloscope, and also to an oscillogram generation system including the digital oscilloscope.

BACKGROUND

An oscilloscope is a very versatile electronic measuring instrument. It can transform an invisible electrical signal into a visible image, which is convenient for people to study the changing process of various electrical phenomena.

When performing analysis and processing, it is generally necessary to monitor information such as color, brightness, and the like of a video signal, and the oscilloscope is used to observe the waveform curves of various signal amplitudes changing with time. The conventional oscilloscope is the digital image oscilloscope with a display screen. However, such an oscilloscope is complex in structure, large in size, not portable, and unable to adapt to outdoor use scenarios, moreover, the content displayed by the conventional oscilloscope is simple, which is not convenient for users to conduct intuitive observations.

It should be noted that the information disclosed in the background section above is only used to enhance the understanding of the background of the present disclosure, and therefore may include information that does not constitute the prior art known to those of ordinary skill in the art.

SUMMARY

An object of the present disclosure is to overcome the above shortcomings of the prior art and provide a digital oscilloscope and an oscillogram generation system.

According to an aspect of the present disclosure, there is provided a digital oscilloscope, including:

a video input interface, configured to receive a digital video signal;

a data processing system, connected to the video input interface, receiving the digital video signal, and processing the digital video signal to generate an oscillogram signal, the oscillogram signal including an oscillogram image signal, and further including at least one of a menu image signal and a frame image signal of the digital video signal;

a video output interface, connected to the data processing system, receiving the signal from the data output circuit and outputting it, and a clock system, connected to the data processing system, to provide a clock signal for the operation of the data processing system.

In an implementation of the present disclosure, the data processing system includes a data input circuit, a processor, a memory and a data output circuit; the data input circuit is connected to the video input interface and is configured to receive the digital video signal; the processor is connected to the data input circuit, and is configured to process image information in the digital video signal to generate the oscillogram signal; the data output circuit is respectively connected to the processor and the video output interface, and is configured to output the oscillogram signal to the video output interface; and the memory is configured to store data signals inside the processor; and wherein the processor includes:

a signal input processing circuit, connected to the data input circuit, and configured to decode the digital video signal to generate a frame image of each frame image;

a frame image analysis circuit, connected to the signal input processing circuit, and configured to extract characteristic data from the frame image;

an oscillogram generation circuit, connected to the frame image analysis circuit, and configured to receive the characteristic data and generate the corresponding oscillogram image signal;

a menu generation circuit, connected to the frame image analysis circuit, and configured to receive the characteristic data and generate the corresponding menu image signal;

a video output processing circuit, respectively connected to the oscillogram generating circuit, the menu generating circuit and the memory, and configured to fuse the oscilloscope image signal and at least one of the menu image signal and the frame image signal of the digital video signal into a fused image signal;

a signal output processing circuit, connected to the video output processing circuit, and configured to encode the fused image signal to generate the oscillogram signal and output the oscillogram signal to the data output circuit.

In an implementation of the present disclosure, the oscillogram generating circuit further includes the following sequentially connected components:

a data structure conversion circuit, further connected to the frame image analysis circuit, and configured to convert the characteristic data into a readable data structure;

an oscilloscope data graphical construction circuit, configured to draw the data structure into an initial oscillogram;

an oscilloscope background image superposition circuit, configured to superpose the initial oscillogram with a background image to generate a composite oscillogram image; and an oscillogram display optimization circuit, configured to perform a display optimization operation on the composite oscillogram image, to generate the oscillogram image signal and output it to the signal output processing circuit.

In an implementation of the present disclosure, a method for the video output processing circuit to generate the fused image signal includes a layer superposition method and a splicing synthesis method.

In an implementation of the present disclosure, the oscilloscope further includes a plurality of first selection devices for selecting a type of the fused image signal, the processor further includes a function selection circuit, the function selection circuit is respectively connected to the first selection devices and the video output processing circuit, and the function selection circuit is configured to generate a first instruction signal according to an instruction of the first selection devices and output the first instruction signal to the video output processing circuit, so that the video output processing circuit selects at least one of the menu image signal and the frame image signal of the digital video signal based on the first instruction signal to fuse with the oscillogram image signal.

Wherein the type of the fused image signal includes the following three: the first one is the fused image signal of the menu image signal and the oscillogram image signal; the second one is the fused image signal of the frame image signal and the oscillogram image signal; and the third one is the fused image signal of the menu image signal, the frame image signal and the oscillogram image signal.

In an implementation of the present disclosure, the oscilloscope further includes a plurality of second selection devices for selecting the type of the oscillogram image signal, the function selection circuit is further respectively connected to the second selection devices, the frame image analysis circuit, the oscillogram generation circuit, and the menu generation circuit, and the function selection circuit is further configured to generate a second instruction signal according to an instruction of the second selection devices and output the second instruction signal to the frame image analysis circuit, the menu generation circuit, and the oscillogram generation circuit, so that the frame image analysis circuit extract the corresponding characteristic data based on the second instruction signal, the oscillogram generating circuit generates the corresponding oscillogram image based on the second instruction signal, and the menu generating circuit generates the corresponding menu image signal based on the second instruction signal.

In an implementation of the present disclosure, the first selection devices and the second selection devices are all buttons.

In an implementation of the present disclosure, the oscilloscope further includes a plurality of prompting devices for prompting a working status, and the prompting devices are light-emitting devices or sound-producing devices.

In an implementation of the present disclosure, the video input interface includes a plurality of different digital video input interfaces, and the video output interface includes a plurality of different digital video output interfaces.

According to another aspect of the present disclosure, there is also provided an oscillogram generation system, including:

the above digital oscilloscope;

a video output device, connected to the video input interface of the oscilloscope; and a display terminal, connected to the video output interface of the oscilloscope, and configured to receive and display the oscillogram signal generated by the oscilloscope.

It is to be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the description. Obviously, the drawings in the following description are just some embodiments of the present disclosure. For those of ordinary skill in the art, other drawings may be obtained based on these drawings without creative efforts.

In the drawings: 1. housing; 2. video input interface; 3. data processing system; 4. video output interface; 5. clock system; 6. power supply system; 7. first selection device; 8. second selection device; 9. prompting device; 10. power interface;

31. data input circuit; 32. processor; 33. memory; 34. data output circuit; 35. first I/O interface; 36. second I/O interface; 37. third I/O interface;

320. function selection circuit; 321. signal input processing circuit; 322. frame image analysis circuit; 323. oscillogram generation circuit; 324. signal output processing circuit; 325. menu generation circuit; 326. video output processing circuit; 327. prompt signal generation circuit; 301, data structure conversion circuit; 302, oscilloscope data graphical construction circuit; 303, oscillogram display optimization circuit; 304, oscilloscope background image superposition circuit; and

100. Oscilloscope; 200. video output device; 300. display terminal.

DETAILED DESCRIPTION

Example implementations will now be described more fully with reference to the accompanying drawings. However, the example implementations can be implemented in various forms and should not be construed as limited to the implementations set forth herein; rather, these implementations are provided so that this disclosure will be thorough and complete, and will fully convey the concept of the example implementations to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms such as "up" and "down" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below". When a structure is "on" other structure(s), it may mean that the structure is integrally formed on the other structure(s), or that the structure is "directly" arranged on the other structure(s), or that the structure is "indirectly" arranged on other structure(s) through another structure.

The terms "a", "an", "the", "said", and "at least one" are used to indicate the presence of one or more elements/ components/etc.; the terms "comprising/comprise" and "including/include" are used to indicate open-ended inclusive means, and means that there may be additional elements/components/etc., in addition to the listed elements/components/etc.; and the terms "first", "second", "third" and the like are only used as markers, and are not a limitation on the number of objects.

Figure 1:
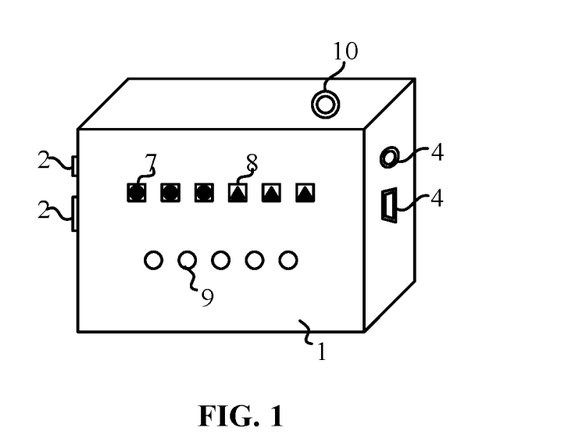
FIG. 1 is a schematic view of an overall structure of an oscilloscope of the present implementation.
Figure 2:
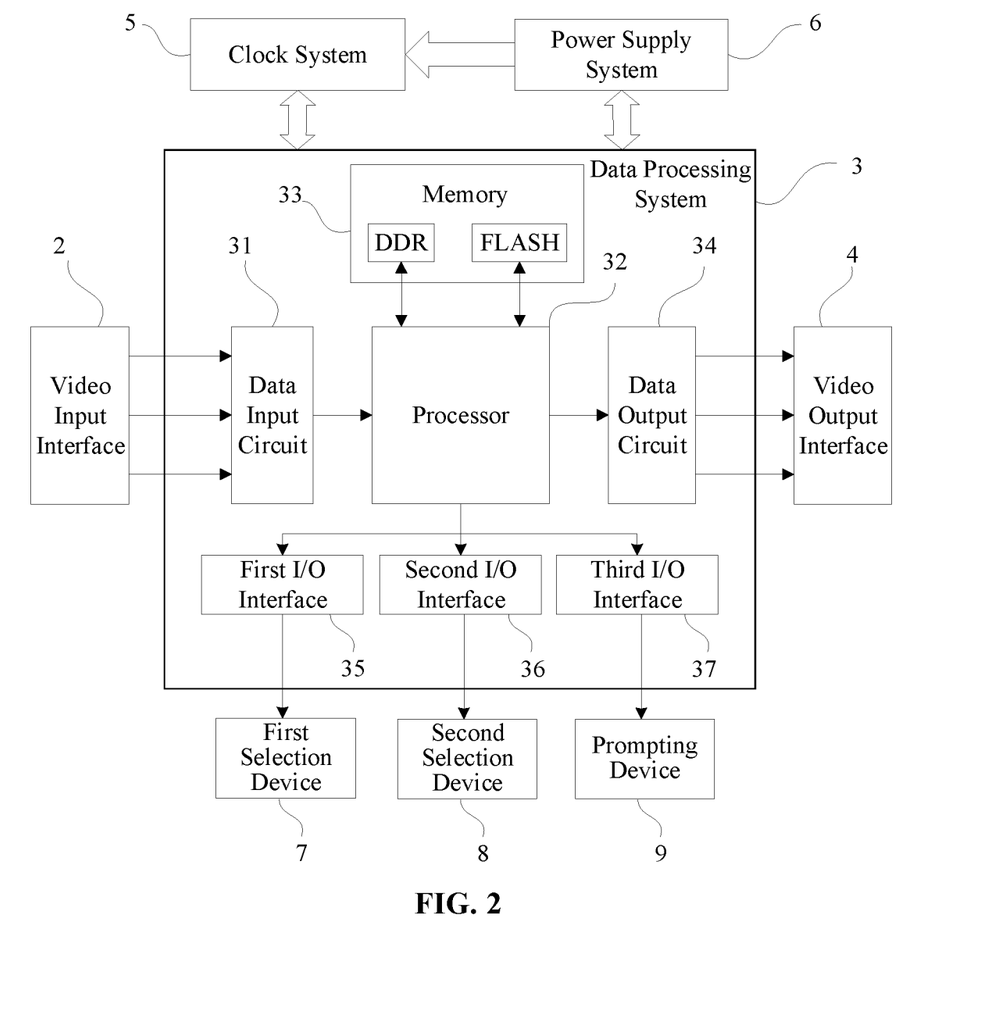
FIG. 2 is a structural schematic view of internal functional circuits of an oscilloscope of the present implementation.

An implementation of the present disclosure provides a digital oscilloscope, which is used to analyze and process frame images in a digital video signal to generate an oscillogram. Referring to FIGS. 1 and 2, the digital oscilloscope according to the implementation of the present disclosure includes a housing 1, a video input interface 2, a data processing system 3, a video output interface 4 and a clock system 5. Wherein the video input interface 2 is disposed on the housing 1 and is configured to receive the digital video signal; the data processing system 3 is disposed in the housing 1, connected to the video input interface 2, receives the digital video signal received from the video input interface 2, and processes the digital video signal to generate an oscillogram signal, wherein the oscillogram signal includes an oscillogram image signal, and further includes a menu image signal and/or a frame image signal of the digital video signal; the video output interface 4 is disposed on the housing 1, connected to the data processing system 3, receives the oscillogram signal generated by the data processing system 3, and outputs the oscillogram signal to other external devices (for example, a display device); the clock system 5 is disposed in the housing 1, connected to the data processing system 3 to provide a clock signal for the operation of the data processing system 3. In addition, a power supply system 6 may be provided in the housing 1. The power supply system 6 is respectively connected to the data processing system 3 and the clock system 5 to provide power for the data processing system 3 and the clock system 5.

The oscilloscope receives the digital video signal input from an external video input device through the video input interface 2, and analyzes and processes the digital video signal by using the data processing system 3, to analyze and process the frame image signal in the digital video signal to generate the oscillogram signal. Then the oscillogram signal is output to an external display terminal through the video output interface 4 to achieve the purpose of monitoring video color, brightness and other information. Compared with a conventional oscilloscope having a display screen, the external oscilloscope of the present disclosure does not require the display screen, but it is connected to the display terminal when the oscillogram needs to be displayed, so as to display the generated oscillogram signal as the oscillogram on the external display terminal. Because the oscilloscope and the display terminal are separated, the structure of the oscilloscope is simplified, the volume thereof is reduced, the portability is improved, and it is easy to move and carry, moreover, it only needs to be connected to the display terminal when in use, which is convenient to use in outdoor places.

On the other hand, in addition to the oscilloscope image signal, the oscilloscope signal generated by the oscilloscope includes the menu image signal and the video source frame image signal. The oscilloscope image may be explained or compared, and it is convenient for users to interpret the oscilloscope image when displayed on the display terminal, which further improves the intuitiveness of the oscilloscope display.

The external digital oscilloscope according to the implementation of the present disclosure will be described in detail below.

As shown in FIGS. 1 and 2, the external digital oscilloscope of the implementation has the housing 1, and the video input interface 2 and the video output interface 4 are respectively provided on opposite sides of the housing 1, such that the oscilloscope 100 may be connected to other devices. The video input interface 2 adopts a digital video input interface, which may include a plurality of different digital video input interfaces, for example, 12G-SDI, 3G-SDI, HDMI, DVI, DP, etc., in order to meet the requirements of different transmission equipment. Similarly, the video output interface 4 may also include a plurality of different digital video output interfaces, such as the several digital video output interfaces as described above, to meet the requirements of different transmission equipment. The video signal may be input through any of the above interfaces, and may be output through any digital video output interface 4 after the data processing system 3 generates the oscillogram signal. In other words, the types of interfaces used for input and output may be the same or different to meet different transmission requirements.

The clock system 5 may be a clock circuit system composed of electronic components such as a clock crystal oscillator and a clock chip, and provides the clock signal for the normal operation of the data processing system 3.

The power supply system 6 may be in the form of an adapter or a USB power supply, and has built-in electronic components such as a power management chip, so as to provide matching power for various chips or components in the entire data processing system 3. Correspondingly, a corresponding power interface 10 may be disposed on the housing 1 of the oscilloscope to provide power input for the device. The power interface 10 may adopt a USB power supply, a DC power supply interface, or the like. In addition, a switch may be disposed on the housing 1 of the oscilloscope to control the power on and off.

As shown in FIG. 2, in the implementation, the data processing system 3 includes a data input circuit 31, a processor 32, a memory 33 and a data output circuit 34. The data input circuit 31 is connected to the video input interface 2 and is configured to receive the digital video signal from the video input interface 2. The processor 32 is connected to the data input circuit 31, and is configured to process image information in the digital video signal to generate the oscillogram signal. The data output circuit 34 is connected to the processor 32 and the video output interface 4, and is configured to output the oscillogram signal to the video output interface 4. The memory 33 is connected to the processor 32 and is configured to store various data signals inside the processor 32.

Figure 3:
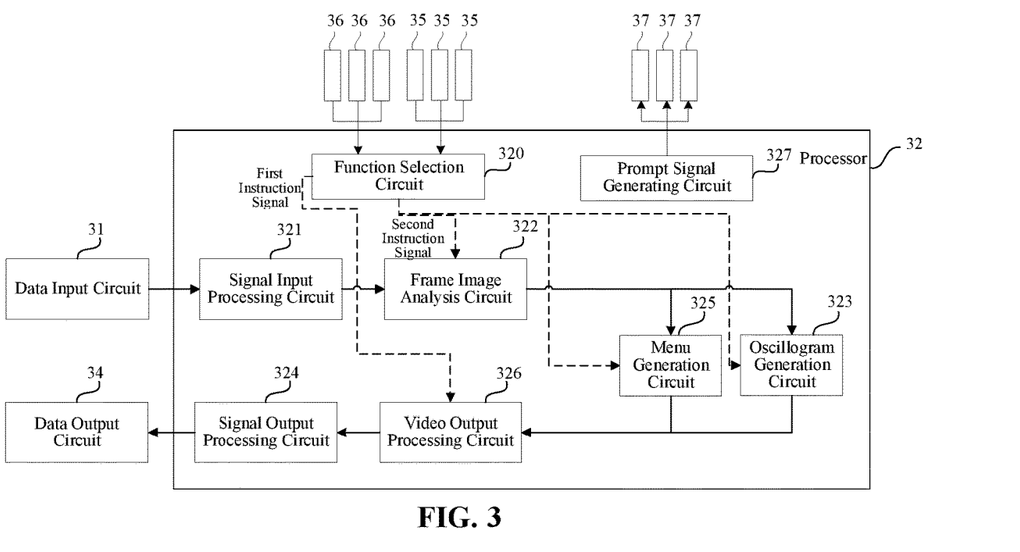
FIG. 3 is a schematic view of functional circuits of a processor of the present implementation.

In an implementation, as shown in FIG. 3, the processor 32 includes a signal input processing circuit 321, a frame image analysis circuit 322, an oscillogram generation circuit 323, a menu generation circuit 325, a video output processing circuit 326, and a signal output processing circuit 324. The signal input processing circuit 321 is connected to the data input circuit 31, receives the digital video signal, and uses a matching interface protocol analysis algorithm according to the currently selected input digital video interface (for example, 12G-SDI, 3G-SDI, HDMI, DVI, DP, etc.) to decode the digital video signal and restore each frame image of the digital video. The frame image analysis circuit 322 is connected to the signal input processing circuit 321, receives and analyzes each image from the signal input processing circuit 321, and extracts characteristic data there-from. The oscillogram generation circuit 323 is connected to the frame image analysis circuit 322, receives the characteristic data and generates the corresponding oscillogram image signal. The menu generation circuit 325 is connected to the frame image analysis circuit 322, receives the characteristic data and generates the corresponding menu image signal. The video output processing circuit 326 is respectively connected to the oscillogram generating circuit 323, the menu generating circuit 325 and the memory 33, and is configured to fuse the oscilloscope image signal and at least one of the menu image signal and the frame image signal of the digital video signal into a fused image signal that can be displayed in one image. The signal output processing circuit 324 is connected to the video output processing circuit 326, receives the fused image signal, selects the matching interface protocol algorithm according to the output interface type to encode the fused image signal, generates the oscillogram signal that meets a protocol standard, and then outputs the oscillogram signal to the data output circuit 34. In the present disclosure, the type of the oscillogram image signal includes, but is not limited to, an image brightness histogram, an image RGB histogram, an image YCbCr histogram, an image brightness waveform, an image RGB waveform, an image YCbCr waveform, and an image chromaticity vector diagram, and the present disclosure is not particularly limited thereto.

In the process of generating the oscillogram signal by the processor 32, the generated various data signals may be buffered by the memory 33, and the next-level processing circuit reads and then processes the corresponding data signals from the memory 33. For example, the signal input processing module sequentially sends each frame of the decoded image to the memory 33 for buffering according to its time sequence. The frame image analysis circuit 322 first reads the corresponding frame image signal from the memory 33 and then analyzes it. The oscillogram generating circuit 323 generates the oscillogram signal, and then the oscillogram signal may be buffered in the memory 33. The signal output processing circuit 324 reads the relevant signal from the memory 33 and then encodes it. In the implementation, the memory 33 includes volatile memory (for example, DDR, DRAM, SDRAM, etc.) and non-volatile memory (for example, FLASH memory, PROM, etc.). The volatile memory is used to provide a cache function when the system is running, and the non-volatile memory is used to provide a storage function of data such as configuration parameters after the system is powered off.

The processor of the embodiment can display at least one of the oscillogram image, the menu image or the video source frame image on the display terminal, such that the users can intuitively observe the oscillogram and the corresponding video source frame image and the menu image on one display terminal, thereby providing the users with an interactive interface. Further, it is convenient for the users to understand the oscillogram information more intuitively. Compared to only seeing the oscillogram, the fused image improves the user's intuitiveness. The menu information generated by the menu generating circuit 325 may include information such as function selection, function parameter setting, current status display, input and output signal configuration, and the like, which can be specifically set according to requirements.

Therefore, there are three types of fused image signal that may be generated by the oscilloscope. Specifically, in the first specific embodiment, the video output processing circuit 326 fuses the oscillogram image signal and the corresponding menu image signal into the fused image signal, and the image finally displayed on the display terminal is the image including the oscillogram and the menu image. In the second specific embodiment, the video output processing circuit 326 fuses the oscillogram image signal and the corresponding frame image signal into the fused image signal, and the image finally displayed on the display terminal is the image including the oscillogram and the frame image. In the third specific embodiment, the video output processing circuit 326 fuses the oscillogram image signal, the corresponding frame image signal, and the menu image signal into the fused image signal, and the image finally displayed on the display terminal is the image including the oscillogram, the frame image and the menu image. In the above embodiments, the users may intuitively learn the currently displayed oscillogram and a corresponding reference image.

It should be noted that when reading the oscillogram image signal, the menu image signal, and the frame image signal from the memory 33 for fusion, it should be ensured that the three correspond to each other.

Figure 4:
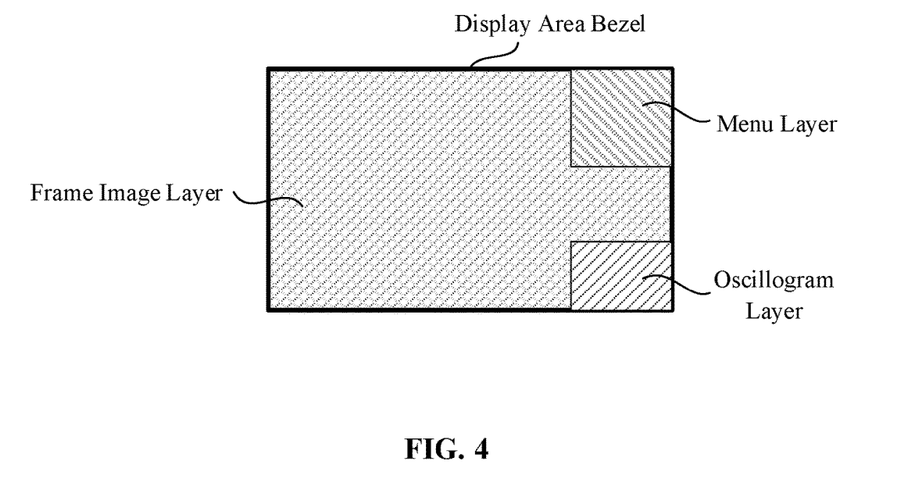
FIG. 4 is a schematic view of an image fusion method of the present implementation.
Figure 5:
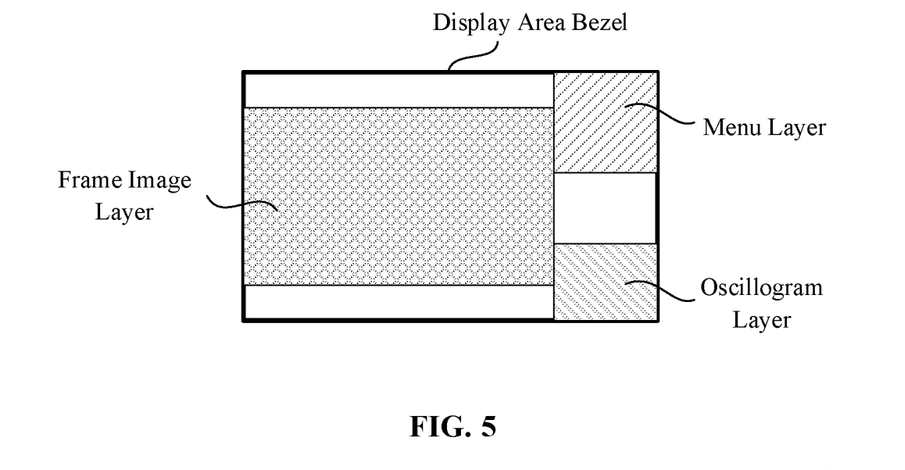
FIG. 5 is a schematic view of another image fusion method of the present implementation.

The fusion method of the oscillogram image signal, the menu image signal and the frame image signal may adopt a layer superposition method or a splicing synthesis method. The layer superposition method may be a method in which both a menu layer and an oscillogram layer are superposed on a frame image layer as shown in FIG. 4. The splicing synthesis method may be a method in which the frame image layer, the menu layer and the oscilloscope layer are arranged side by side as shown in FIG. 5. Of course, there may be other superposition and splicing methods, or other fusion methods may be used.

Figure 6:
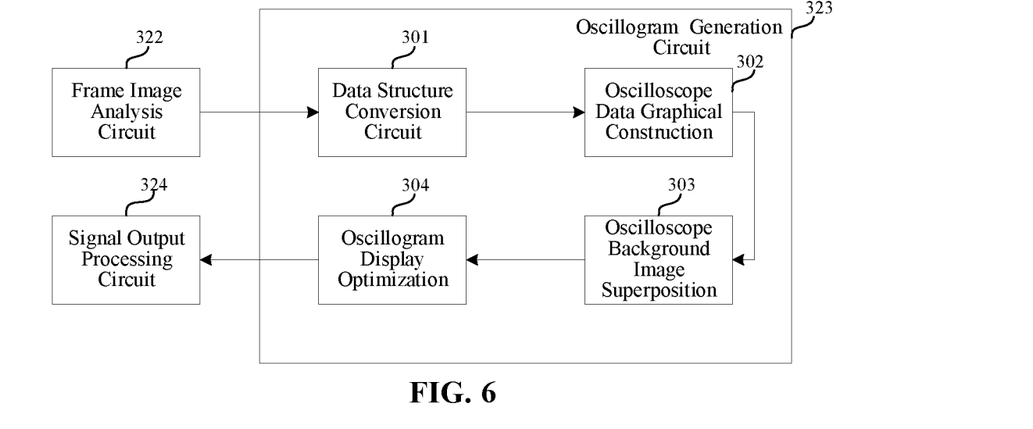
FIG. 6 is a schematic view of functional circuits of an oscillogram generating circuit of the present implementation.

In a specific embodiment, referring to FIG. 6, the oscillogram generating circuit 323 sequentially includes a data structure conversion circuit 301, an oscilloscope data graphical construction circuit 302, an oscilloscope background image superposition circuit 303, and an oscillogram display optimization circuit 304. After the characteristic data from the frame image analysis circuit 322 is buffered in the internal memory, it first enters the data structure conversion circuit 301, which converts the characteristic data into a data structure that is easy to read. The data structure conversion circuit 301 pre-stores algorithms for converting various characteristic data and algorithms for various conversion requirements, and the corresponding algorithms may be specifically selected for the structural conversion according to requirements. Secondly, in the oscillometric data graphical construction circuit 302, the integrated data structure is drawn into the required oscillogram. Then, in the oscilloscope background image superposition circuit 303, the generated oscilloscope data stream and the corresponding background image are superposed to generate the oscilloscope with indicator marks such as a mark and a scale. Finally, in the oscillogram display optimization circuit 304, a display optimization operation such as ratio and scale conversion, multi-channel oscillogram splicing, etc., is performed on the generated oscillogram, to generate the integrated oscillogram signal which is output to the signal output processing circuit 324. In other embodiments, the oscillogram generating circuit 323 may also be formed by other modules, which will not be listed here.

In an implementation, in order to realize the selection of the type of the fused image signal, by referring to FIGS. 1 to 3, the oscilloscope 100 further includes first selection devices 7, and the first selection devices 7 are configured to generate a first instruction. The processor 32 further includes a function selection circuit 320. The data processing system 3 further includes a plurality of first I/O interfaces 35. An input terminal of each first I/O interface 35 is connected to each first selection device 7 in a one-to-one correspondence, and an output terminal of each first I/O interface 35 is connected to the function selection circuit 320. The function selection circuit 320 is configured to generate a first instruction signal according to the first instruction. The function selection circuit 320 is also connected to the video output processing circuit 326, and sends the generated first instruction signal to the video output processing circuit 326, so that the video output processing circuit 326 selects at least one of the menu image signal and the frame image signal to fuse with the oscillogram image signal. Specifically, the first selection devices 7 may be buttons disposed on the housing 1, and each button generates one instruction signal corresponding to one type of fused image signal. When the user presses one of the buttons, the video output processing circuit 326 performs the image fusion processing according to the corresponding instruction signal. Of course, in other embodiments, the first selection devices 7 may also be other structures such as knobs, which will not be listed here. The first I/O interface 35 may adopt a general programmable I/O interface (GPIO interface) to simplify the device structure.

In an implementation, as described above, since the type of the oscillogram image signal includes the brightness histograms, the RGB histogram, the brightness waveform, and the like, in order to realize the selection of type of the oscillogram image signal and improve the selectivity of the oscilloscope function, by referring to FIGS. 1 to 3, the oscilloscope is further provided with second selection devices 8, and the second selection devices 8 are configured to generate a second instruction; and the data processing system 3 further includes a plurality of second I/O interfaces 36. An input terminal of each second I/O interface is connected to each second selection device 8 in a one-to-one correspondence, and an output terminal of each second I/O interface 36 is connected to the function selection circuit 320. The function selection circuit 320 is also configured to generate a second instruction signal according to the second instruction. The function selection circuit 320 may be connected to the frame image analysis circuit 322, the oscillogram generation circuit 323, and the menu generation circuit 325, respectively, to send the second instruction signal to these three circuits, such that the frame image analysis circuit 322 selects one of multiple types of the oscillogram image signal to extract the corresponding characteristic data based on the second instruction signal, the oscillogram generating circuit 323 generates the corresponding oscillogram image based on the second instruction signal, and the menu generating circuit 325 generates the corresponding menu image based on the second instruction signal. Similar to the first selection devices 7, the second selection devices 8 may also be buttons disposed on the housing 1, and the second selection devices 8 may also other structures such as knobs which will not be listed here. The second I/O interface 36 may also adopt the general programmable I/O interface.

It should be noted that in FIG. 3, the connection relationship between the function selection circuit 320 and other circuits is indicated by dotted lines. The function of the function selection circuit 320 may be understood as being used to generate the corresponding instruction signal according to the user's instruction, and other functional circuits are used to generate corresponding results according to the instruction signal, so that the oscilloscope finally outputs the oscillogram signal that the users need.

In an implementation, in order to facilitate the users to know the current working status of the oscilloscope in real time, by referring to FIGS. 1 to 3, a plurality of prompting devices 9 are also provided on the oscilloscope, and the processor 32 further includes a prompt signal generating circuit 327 capable of generating a working state prompt signal (for example, whether the current video format is supported, whether the current system is working normally, the current power input condition, etc.). The data processing system 3 is also provided with a plurality of third I/O interfaces 37. An input terminal of each third I/O interface 37 is connected to the prompt signal generating circuit 327, and an output terminal of each third I/O interface 37 is connected to each prompting device 9 in a one-to-one correspondence. The third I/O interface 37 is configured to transmit the working state prompt signal issued by the prompt signal generating circuit 327 to the prompting device 9. The working state prompt signal may be a switch signal for controlling the corresponding prompting device 9 to turn on or off. Specifically, the prompting devices 9 may be light-emitting devices (for example, indicator lights) disposed on the housing 1, and one working state prompt signal controls one indicator light to turn on or off. The prompting devices 9 may also be sound-producing devices (for example, speakers, etc.), which will not be listed here. The third I/O interface 37 may also adopt the general programmable I/O interface. Through the prompting devices, the users can know whether the current working state of the oscilloscope is normal.

The processor 32 in the above implementations may be specifically selected from a CPU, GPU, and other processors that require software support, or an FPGA, ASIC, and other integrated software and hardware processors, such as Zynq, MPSoC, and other heterogeneous FPGA processors, which have higher execution efficiency. The specific type of the processor 32 is not particularly limited in the present disclosure, and can be selected according to actual needs.

Figure 7:
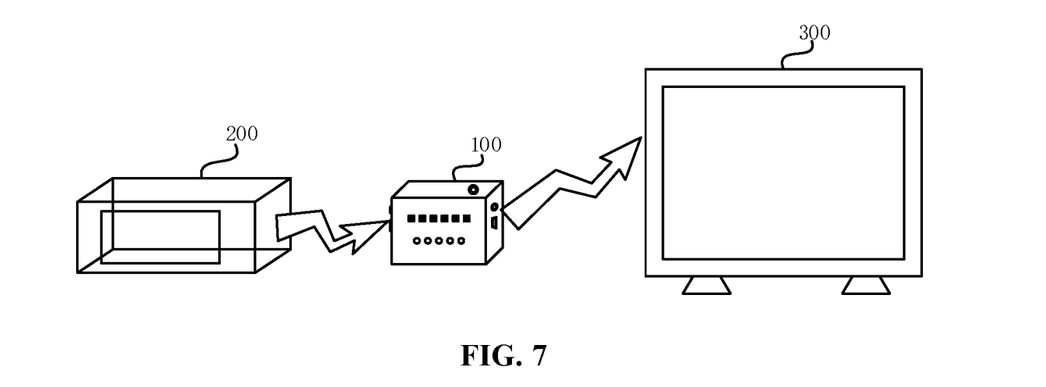
FIG. 7 is a schematic view of an overall structure of an oscillogram generating system of the present implementation.

An implementation of the present disclosure further provides an oscillogram generation system, referring to FIG. 7, including: the above digital oscilloscope 100, a video output device 200, and a display terminal 300. The video output device 200 is connected to the video input interface 2 of the oscilloscope 100; and the display terminal 300 is connected to the video output interface 4 of the oscilloscope 100, and is configured to receive and display the oscillogram signal generated by the oscilloscope 100.

The video output device 200 may be any device capable of outputting digital video, such as a signal generator, a video player, a camera, and the like. The display terminal 300 may be any product or component with a display function, such as a TV, a notebook computer, a tablet computer, a mobile phone, a navigation, an e-book, a digital photo frame, an advertising light box, and the like. The present disclosure does not specifically limit the specific types of these two components.

In summary, the structure of each component of the oscillogram generating system of the present disclosure is independent of each other, which is convenient for installation according to the needs of a demonstration occasion. It is also easy to maintain, saves maintenance costs, and has rich functions and high selectivity.

Those skilled in the art may easily contemplate other embodiments of the present disclosure after considering the specification and practicing the invention disclosed herein. This application is intended to cover any variations, uses, or adaptive changes of the present disclosure. These variations, uses, or adaptive changes follow the general principles of the present disclosure and include the common knowledge or conventional technical means in the technical field that are not disclosed in the present disclosure. The description and the embodiments are only regarded as exemplary, and the true scope and spirit of the present disclosure are pointed out by the appended claims.

What is claimed is:

1. A digital oscilloscope, comprising:
 a video input interface, configured to receive a digital video signal;
 a data processing system, connected to the video input interface, configured to receive the digital video signal, and process the digital video signal to generate an oscillogram signal, the oscillogram signal comprising an oscillogram image signal, and further comprising both a menu image signal and a frame image signal of the digital video signal;
 a video output interface, connected to the data processing system, and configured to receive the oscillogram signal for output, and
 a clock system, connected to the data processing system, and configured to provide a clock signal for the data processing system,
 wherein the data processing system comprises a data input circuit, a processor, a memory and a data output circuit the data input circuit is connected to the video input interface and is configured to receive the digital video signal; the processor is connected to the data input circuit, and is configured to process image information in the digital video signal to generate the oscillogram signal; the data output circuit is respectively connected to the processor and the video output interface, and is configured to output the oscillogram signal to the video output interface; and the memory is configured to store data signals inside the processor; and
 wherein the processor comprises:
 a signal input processing circuit, connected to the data input circuit, and configured to decode the digital video signal to generate a frame image of each frame image;
 a frame image analysis circuit, connected to the signal input processing circuit, and configured to extract characteristic data from the frame image;
 an oscillogram generation circuit, connected to the frame image analysis circuit, and configured to receive the characteristic data and generate the corresponding oscillogram image signal;
 a menu generation circuit, connected to the frame image analysis circuit, and configured to receive the characteristic data and generate the corresponding menu image signal;
 a video output processing circuit, respectively connected to the oscillogram generating circuit, the menu generating circuit and the memory, and configured to fuse the oscilloscope image signal and at least one of the menu image signal and the frame image signal of the digital video signal into a fused image signal;
 a signal output processing circuit, connected to the video output processing circuit, and configured to encode the fused image signal to generate the oscillogram signal and output the oscillogram signal to the data output circuit.

2. The digital oscilloscope according to claim 1, wherein the oscillogram generating circuit comprises following components sequentially connected:
 a data structure conversion circuit, connected to the frame image analysis circuit, and configured to convert the characteristic data into a readable data structure;
 an oscilloscope data graphical construction circuit, configured to generate an initial oscillogram based on the data structure;
 an oscilloscope background image superposition circuit, configured to superpose the initial oscillogram with a background image to generate a composite oscillogram image; and
 an oscillogram display optimization circuit, configured to perform a display optimization operation on the composite oscillogram image, to generate the oscillogram image signal and output the oscillogram image signal to the signal output processing circuit.

3. The digital oscilloscope according to claim 1, wherein a method for the video output processing circuit to generate the fused image signal comprises a layer superposition method and a splicing synthesis method.

4. The digital oscilloscope according to claim 1, further comprising a plurality of first selection devices configured to select a type of the fused image signal, the processor further comprises a function selection circuit, the function selection circuit is respectively connected to the first selection devices and the video output processing circuit, and the function selection circuit is configured to generate a first instruction signal according to an instruction of the first selection devices and output the first instruction signal to the video output processing circuit, causing the video output processing circuit to select at least one of the menu image signal and the frame image signal of the digital video signal based on the first instruction signal to be fused with the oscillogram image signal, and
 wherein types of the fused image signal comprise: a fused image signal of the menu image signal and the oscillogram image signal; a fused image signal of the frame image signal and the oscillogram image signal; and a fused image signal of the menu image signal, the frame image signal and the oscillogram image signal.

5. The digital oscilloscope according to claim 4, further comprising a plurality of second selection devices configured to select a type of the oscillogram image signal, the function selection circuit is further respectively connected to the second selection devices, the frame image analysis circuit, the oscillogram generation circuit, and the menu generation circuit, and the function selection circuit is further configured to generate a second instruction signal according to an instruction of the second selection devices and output the second instruction signal to the frame image analysis circuit, the menu generation circuit, and the oscillogram generation circuit, causing the frame image analysis circuit to extract corresponding characteristic data based on the second instruction signal, causing the oscillogram generating circuit to generate corresponding oscillogram image based on the second instruction signal, and causing the menu generating circuit to generate corresponding menu image signal based on the second instruction signal.

6. The digital oscilloscope according to claim 5, wherein the first selection devices and the second selection devices are buttons.

7. The digital oscilloscope according to claim 1, further comprising a plurality of prompting devices configured to prompt a working status, and the prompting devices are light-emitting devices or sound-producing devices.

8. The digital oscilloscope according to claim 1, wherein the video input interface comprises a plurality of different digital video input interfaces, and the video output interface comprises a plurality of different digital video output interfaces.

9. An oscillogram generation system, comprising:

a digital oscilloscope, wherein the digital oscilloscope comprises:

a video input interface, configured to receive a digital video signal;

a data processing system, connected to the video input interface, configured to receive the digital video signal, and process the digital video signal to generate an oscillogram signal, the oscillogram signal comprising an oscillogram image signal, and further comprising both a menu image signal and a frame image signal of the digital video signal;

a video output interface, connected to the data processing system, and configured to receive the oscillogram signal for output, and a clock system, connected to the data processing system, and configured to provide a clock signal for the data processing system;

a video output device, connected to the video input interface of the oscilloscope; and a display terminal, connected to the video output interface of the oscilloscope, and configured to receive and display the oscillogram signal generated by the oscilloscope, wherein the data processing system comprises a data input circuit, a processor, a memory and a data output circuit the data input circuit is connected to the video input interface and is configured to receive the digital video signal; the processor is connected to the data input circuit, and is configured to process image information in the digital video signal to generate the oscillogram signal; the data output circuit is respectively connected to the processor and the video output interface, and is configured to output the oscillogram signal to the video output interface; and the memory is configured to store data signals inside the processor; and wherein the processor comprises:

a signal input processing circuit, connected to the data input circuit, and configured to decode the digital video signal to generate a frame image of each frame image;

a frame image analysis circuit, connected to the signal input processing circuit, and configured to extract characteristic data from the frame image;

an oscillogram generation circuit, connected to the frame image analysis circuit, and configured to receive the characteristic data and generate the corresponding oscillogram image signal;

a menu generation circuit, connected to the frame image analysis circuit, and configured to receive the characteristic data and generate the corresponding menu image signal;

a video output processing circuit, respectively connected to the oscillogram generating circuit, the menu generating circuit and the memory, and configured to fuse the oscilloscope image signal and at least one of the menu image signal and the frame image signal of the digital video signal into a fused image signal;

a signal output processing circuit, connected to the video output processing circuit, and configured to encode the fused image signal to generate the oscillogram signal and output the oscillogram signal to the data output circuit.

10. The oscillogram generation system according to claim 9, wherein the oscillogram generating circuit comprises following components sequentially connected:

a data structure conversion circuit, connected to the frame image analysis circuit, and configured to convert the characteristic data into a readable data structure;

an oscilloscope data graphical construction circuit, configured to generate an initial oscillogram based on the data structure;

an oscilloscope background image superposition circuit, configured to superpose the initial oscillogram with a background image to generate a composite oscillogram image; and an oscillogram display optimization circuit, configured to perform a display optimization operation on the composite oscillogram image, to generate the oscillogram image signal and output the oscillogram image signal to the signal output processing circuit.

11. The oscillogram generation system according to claim 9, wherein a method for the video output processing circuit to generate the fused image signal comprises a layer superposition method and a splicing synthesis method.

12. The oscillogram generation system according to claim 9, further comprising a plurality of first selection devices configured to select a type of the fused image signal, the processor further comprises a function selection circuit, the function selection circuit is respectively connected to the first selection devices and the video output processing circuit, and the function selection circuit is configured to generate a first instruction signal according to an instruction of the first selection devices and output the first instruction signal to the video output processing circuit, causing the video output processing circuit to select at least one of the menu image signal and the frame image signal of the digital video signal based on the first instruction signal to be fused with the oscillogram image signal, and wherein types of the fused image signal comprise: a fused image signal of the menu image signal and the oscillogram image signal; a fused image signal of the frame image signal and the oscillogram image signal; and a fused image signal of the menu image signal, the frame image signal and the oscillogram image signal.

13. The oscillogram generation system according to claim 12, further comprising a plurality of second selection devices configured to select a type of the oscillogram image signal, the function selection circuit is further respectively connected to the second selection devices, the frame image analysis circuit, the oscillogram generation circuit, and the menu generation circuit, and the function selection circuit is further configured to generate a second instruction signal according to an instruction of the second selection devices and output the second instruction signal to the frame image analysis circuit, the menu generation circuit, and the oscillogram generation circuit, causing the frame image analysis circuit to extract corresponding characteristic data based on the second instruction signal, causing the oscillogram generating circuit to generate corresponding oscillogram image based on the second instruction signal, and causing the menu generating circuit to generate corresponding menu image signal based on the second instruction signal.

14. The oscillogram generation system according to claim 13, wherein the first selection devices and the second selection devices are buttons.

15. The oscillogram generation system according to claim 9, further comprising a plurality of prompting devices configured to prompt a working status, and the prompting devices are light-emitting devices or sound-producing devices.

16. The oscillogram generation system according to claim 9, wherein the video input interface comprises a plurality of different digital video input interfaces, and the video output interface comprises a plurality of different digital video output interfaces.

* * * * *